(12) United States Patent
Colburn et al.

(10) Patent No.: US 8,976,077 B2
(45) Date of Patent: Mar. 10, 2015

(54) WIDEBRAND ADAPTABLE ARTIFICIAL IMPEDANCE SURFACE

(75) Inventors: Joseph S. Colburn, Malibu, CA (US); Carson R. White, Agoura Hills, CA (US); Daniel J. Gregoire, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 239 days.

(21) Appl. No.: 13/441,659

(22) Filed: Apr. 6, 2012

(65) Prior Publication Data

US 2012/0256811 A1 Oct. 11, 2012

Related U.S. Application Data (60) Provisional application No. 61/537,488, filed on Sep. 21, 2011, provisional application No. 61/473,076, filed on Apr. 7, 2011, provisional application No. 61/505,037, filed on Jul. 6, 2011.

(51) Int. Cl.
  *H01Q 15/02* (2006.01)
  *H01Q 15/14* (2006.01)
  *H05K 1/16* (2006.01)
  *H01Q 15/00* (2006.01)

(52) U.S. Cl.
  CPC ............ *H01Q 15/148* (2013.01); *H05K 1/165* (2013.01); *H01Q 15/0066* (2013.01); *H01Q 15/002* (2013.01); *H01Q 15/008* (2013.01); *H05K 2203/162* (2013.01)
  USPC ................................... 343/909; 343/700 MS (58) Field of Classification Search
  CPC . H01Q 15/0006; H01Q 15/0066; H01Q 1/38; H01Q 15/008; H01Q 21/061
  USPC ........................... 343/909, 700 MS, 846, 745
  See application file for complete search history.

(56) References Cited

U.S. PATENT DOCUMENTS

| | | | |
|---|---|---|---|
| 4,234,960 | A | 11/1980 | Spilsbury |
| 4,904,952 | A | 2/1990 | Tanimoto |
| 5,392,002 | A | 2/1995 | Delano |
| 5,489,878 | A | 2/1996 | Gilbert |
| 6,081,167 | A | 6/2000 | Kromat |
| 6,483,480 | B1 | 11/2002 | Sievenpiper |
| 6,538,621 | B1 | 3/2003 | Sievenpiper et al. |
| 6,768,472 | B2 | 7/2004 | Alexopoulos et al. |
| 7,245,269 | B2 * | 7/2007 | Sievenpiper et al. ......... 343/909 |
| 7,586,384 | B2 | 9/2009 | Ranta |
| 7,847,633 | B2 | 12/2010 | Kinget |
| 7,852,174 | B2 | 12/2010 | Cathelin |

(Continued)

FOREIGN PATENT DOCUMENTS

WO 2006054246 A1 5/2006

OTHER PUBLICATIONS

ISR for related PCT/US/2012/032638 mailed on Oct. 29, 2012.

(Continued)

*Primary Examiner* — Hoanganh Le
(74) *Attorney, Agent, or Firm* — Ladas & Parry (57) ABSTRACT

A tunable impedance surface, the tunable surface including a plurality of elements disposed in a two dimensional array; and an arrangement of variable negative reactance circuits for controllably varying negative reactance between at least selected ones of adjacent elements in the aforementioned two dimensional array.

14 Claims, 5 Drawing Sheets

(56) References Cited

U.S. PATENT DOCUMENTS

| | | | |
|---|---|---|---|
| 7,880,568 B2 | 2/2011 | Amin et al. | |
| 8,111,111 B2 | 2/2012 | Van Bezooijen | |
| 8,263,939 B2* | 9/2012 | Delaney et al. | 250/358.1 |
| 8,358,989 B2 | 1/2013 | Kakuya | |
| 8,374,561 B1 | 2/2013 | Yung | |
| 8,436,785 B1* | 5/2013 | Lai et al. | 343/909 |
| 8,639,203 B2 | 1/2014 | Robert | |
| 2002/0041205 A1 | 4/2002 | Oppelt | |
| 2004/0227668 A1* | 11/2004 | Sievenpiper | 343/700 MS |
| 2005/0184922 A1 | 8/2005 | Ida | |
| 2007/0182639 A1* | 8/2007 | Sievenpiper et al. | 343/700 MS |
| 2008/0242237 A1 | 10/2008 | Rofougaran | |
| 2008/0284674 A1 | 11/2008 | Herz et al. | |
| 2010/0149430 A1 | 6/2010 | Fulga | |
| 2010/0225395 A1 | 9/2010 | Patterson | |

OTHER PUBLICATIONS

ISR for related PCT/US2012/032648 mailed on Dec. 14, 2012.
U.S. Appl. No. 12/768,563, filed Apr. 27, 2010, Michael W. Yung.
U.S. Appl. No. 13/441,730, filed Apr. 6, 2012, Donald A. Hitko.
B. H. Fong, et al., "Scalar and tensor holographic artificial impedance surfaces", *Trans. Antennas and Propag.*, vol. 58, pp. 3212-3221, Oct. 2010.
J.S. Colburn, et al., "Adaptive Artificial Impedance Surface Conformal Antennas", *Proc. IEEE Antennas and Propagation Society Int. Symp.*, 2009, pp. 1-4.
D.J. Kern, D.H. Werner and M. J. Wilhelm, "Active negative impedance loaded EBG structures for the realization of ultra-wideband artificial magnetic conductor", *Proc. IEEE Antennas and Propagation Society Int. Symp.*, 2003, pp. 427-430.
S.E. Sussman-Fort and R. M. Ruddish "Non-foster impedance matching of electrically-small antennas", *IEEE Trans. Antennas and Propagation.* 57(8). Aug. 2009.
K. Song and R.G. Rojas, "Non-foster impedance matching of electrically small antennas, "*Proc. IEEE Ant. Prop. Int. Symp.*, Jul. 2010.
C.R. White, J.W. May and J.S. Colburn, "A Variable negative-inductance integrated circuit at UHF frequencies", *IEEE MWCL*, 22(1), Jan. 2012.
D.J. Gregoire, C.R. White, and J.S. Colburn, "Non-foster metamaterials", *Antenna Applications Symposium* 2011, Sep. 2011.
J.G. Linvill, "Transistor negative-impedance converters", *Proceedings of the IRE*, vol. 41, pp. 725-729, Jun. 1953.
R.L. Brennan, et al., "The CMOS negative impedance converter", *IEEE Journal of Solid-State Circuits*, 32(5), Oct. 1988.
Slideshow for "Matching network design using non-foster impedances" by Stephen E. Sussman-Fort, Ph.D. of EDO Corporation (printed from the Internet on Jun. 30, 2011), (43 pages).
S.E. Sussman-Fort and R.M. Rudish. EDO Corporation, "Increasing efficiency or bandwidth of electrically small transmit antennas by impedance matching with non-foster circuits", Progress in Electromagnetics Research Symposium 2006, Cambridge, USA, Mar. 26-29.
Cyril Svetoslavov Mechkov, "A heuristic approach to teaching negative resistance phenomenon," *Third International Conference—Computer Science '06*, Istanbul, Turkey, Oct. 12-15, 2006 (6 pgs).
White Paper by the Virginia Tech Antenna Group of Wireless @ Virginia Tech "Non-foster reactance matching for antennas," pp. 1-5 <http://wireless.vt.edu/research/Antennas_Propagation/Whitepapers/Whitepaper-Non-Foster_Reactance_Matching_for_Antennas.pdf>.
S.E. Sussman and R.M. Rudish, "Non-Foster Impedance matching for transmit applications," *IEEE Xplore*, EDO Corporation and Dept. of Electrical and Computer Engineering. pp. 53-56, Mar. 6-8, 2006.
S.E. Sussman-Fort, "Gyrator-based biquad filters and negative impedance converters for microwaves," *International Journal of RF and Microwave computer-aided engineering.* 8(2):86-101, 1998.
S.E. Sussman-Fort, "Matching network design using non-foster impedances," *International Journal of RF and Microwave Computer-Aided Engineering*, 16(2), pp. 135-142, Feb. 2006.
IPRP for corresponding PCT/US2012/045632 mailed on Jul. 10, 2013.
IPRP for corresponding PCT/US2012/32638 mailed on Jun. 27, 2013.
From U.S. Appl. No. 12/768,563 (now U.S. Patent No. 8,374,561), Application and Office Actions including but not limited to the Office Actions dated Jun. 13, 2012; Oct. 9, 2012; and Oct. 23, 2012.
From U.S. Appl. No. 13/177,479, Application and Office Actions.
From U.S. Appl. No. 13/441,730, Application and Office Actions.
From U.S. Appl. No. 13/472,396, Application and Office Actions.
PCT International Preliminary Report on Patentability (Chapter I) dated Oct. 8, 2013 for PCT Application No. PCT/US2012/032648 with PCT Written Opinion mailed on Dec. 14, 2012.
PCT Written Opinion mailed on Oct. 29, 2012 from PCT/US2012/032638.
PCT Search Report and Written Opinion dated Jan. 10, 2013 from PCT/US2012/045632.
Bezooijen, et al. "RF-MEMS based adaptive antenna matching module," IEEE Radio Frequency Integrated Circuits Symposium, p. 573-576, 2007.
Staple, et al. "The End of Spectrum Scarcity," published by IEEE Spectrum, Mar. 2004, pp. 1-5.
From U.S. Appl. No. 13/441,730, Office Action mailed on Mar. 13, 2014.
From U.S. Appl. No. 13/177,479 (now published as US 2013-0009720 A1), Office Action mailed on Jun. 4, 2014.
From U.S. Appl. No. 13/441,730 (now published as US 2012-0256709), Office Action mailed on Jul. 28, 2014.
From U.S. Appl. No. 13/472,396 (now published as US 2013-0009722), Office Action mailed on Jul. 30, 2014.
EPO Supplementary European Search Report with European Search Opinion dated Jul. 29, 2014 from European Patent Application No. 12767559.3.
Hrabar S., et al., "Towards active dispersion less ENZ metamaterial for cloaking applications", Metamaterials, Elsevier BV, NL, vol. 4, No. 2-3, Aug. 1, 2010, pp. 89-97.
Gregoire, Daniel J., et al., "Wideband Artificial Magnetic Conductors Loaded With Non-Foster Negative Inductors", IEEE Antennas and Wireless Propagation Letters, IEEE, Piscataway, NJ, US, vol. 10, Dec. 26, 2011, pp. 1586-1589.
Kern D. J., et al., "Design of Reconfigurable Electromagnetic Bandgap Surfaces as Artificial Magnetic Conducting Ground Planes and Absorbers", Antennas and Propagation Society International Symposium 2006, IEEE Albuquerque, NM, USA Jul. 9-14, 2006, Piscataway, NJ, USA, IEEE, Piscataway, NJ, USA, Jul. 9, 2006, pp. 197-200.

\* cited by examiner

WIDEBRAND ADAPTABLE ARTIFICIAL IMPEDANCE SURFACE

CROSS REFERENCE TO RELATED APPLICATIONS

This application claims the benefit of the following U.S. provisional applications: (i) U.S. Provisional Patent Application Ser. No. 61/537,488 entitled "Wideband Tunable Impedance Surfaces", filed Sep. 21, 2011; (ii) U.S. Provisional Patent Application Ser. No. 61/473,076 entitled "Wideband Adaptable Artificial Impedance Surface", filed Apr. 7, 2011; and (iii) U.S. Provisional Patent Application Ser. No. 61/505,037 entitled "Differential Negative Impedance Converters and Inverters with Tunable Conversion Ratios" filed Jul. 6, 2011, all of which are hereby incorporated herein by reference.

This application is also related to U.S. patent application Ser. No. 12/768,563 entitled "Non-Foster Impedance Power Amplifier", filed Apr. 27, 2010, the disclosure of which is hereby incorporated herein by reference.

This application is also related to U.S. patent application Ser. No. 13/441,730 filed on the same date as this application and entitled "Differential Negative Impedance Converters and Inverters with Tunable Conversion Ratios", the disclosure of which is hereby incorporated herein by reference.

TECHNICAL FIELD

This disclosure relates to tunable impedance surfaces having improved bandwidths. The term, "tunable impedance surface" is meant to refer to a class of surfaces called Artificial Impedance Surfaces (AISs), Artificial Magnetic Conductors (AMCs) and Frequency Selective Surfaces (FSSs), and this disclosure relates to the use of circuits with variable negative inductance in order provide not only tunability but also a wider bandwidth than known in the prior art. In the tunable impedance surface, the impedance which a wave sees, either a free-space plane wave or an attached surface wave, is variable and has wider bandwidth performance than traditional passive artificial impedance surfaces and prior art passive artificial impedance surfaces loaded with varactors. In particular, this disclosure relates to the loading of a traditional passive AIS/AMC/FSS with tunable negative inductors realized with Non-Foster Circuit (NFC) technology.

BACKGROUND

Conformal and hidden antennas are desirable on many mobile platforms for reasons of aerodynamics and styling, among others. Such antennas have been implemented as or on Artificial Impedance Surfaces (AIS) and have been associated with Frequency Selective Surfaces (FSS). AIS can also be referred to as Artificial Magnetic Conductors (AMC), particularly when a separate antenna is disposed on it. AMC, AIS and FSS are all well known in the art and look very similar to each other which means that persons skilled in the art have not always maintained bright lines of distinction between these terms. AMC, AIS and FSS are generically referred to as impedance surfaces and if they are tunable, as tunable impedance surfaces herein.

AIS and AMC tend to have a ground plane which is closely spaced from an array of small, electrically conductive patches. The AIS can serve as an antenna itself whereas an AMC tends to have, in use, a separate antenna disposed on it. Other than the manner of use (and where an antenna is specifically mounted on one), an AIS and a AMC are otherwise basically pretty much identical. The FSS, on the other hand, tends to have no ground plane and therefor it can be opaque (reflective) at certain frequencies and transmissive at other frequencies, much like an optical filter. The FSS look much like a AMC or a AIS, except that there is typically no ground plane. All of these devices (AMC, AIS and FSS) operate at RF frequencies and have many applications at UHF and higher frequencies. Typical prior art AMC, AIS and FSS are either completely passive in nature or utilize varactors (for example) to tune the AMC/AIS/FSS as desired. See, for example:

B. H. Fong, J. S. Colburn, J. J. Ottusch, J. L Visher and D. F. Sievenpiper; "Scalar and Tensor Holographic Artificial Impedance Surfaces", *Trans. Antennas and Propag.*, vol. 58, pp. 3212-3221, October 2010, which discusses a passive AIS. The disclosure of this document is hereby incorporated herein by reference.

J. S. Colburn, A. Lai, D. F. Sievenpiper, A. Bekaryan, B. H. Fong, J. J. Ottusch and P. Tulythan; "Adaptive Artificial Impedance Surface Conformal Antennas", in *Proc. IEEE Antennas and Propagation Society Int. Symp.*, 2009, pp 1-4, which discusses tunable AIS.

D. Sievenpiper, G. Tangonan, R. Y. Loo, and J. H. Schaffner, U.S. Pat. No. 6,483,480 issued Nov. 19, 2002 and entitled "Tunable Impedance Surface".

D. Sievenpiper, G. Tangonan, R. J. Harvey, R. Y. Loo, and J. H. Schaffner, U.S. Pat. No. 6,538,621 issued Mar. 25, 2003 and entitled "Tunable Impedance Surface".

At VHF and UHF frequencies, however, many relevant platforms which might use AIS/FSS antenna technology are on the order of one wavelength or less in size, which dictates that the antennas be electrically small. Therefore, the performance is limited by the fundamental bandwidth-efficiency tradeoff given by the Chu limit when passive matching is employed.

A wideband artificial magnetic conductor (AMC), a special case of an AIS, can be realized by loading a passive artificial magnetic conductor structure with NFCs (i.e. negative inductance and negative capacitance) as suggested by D. J. Kern, D. H. Werner and M. J. Wilhelm, "Active Negative Impedance Loaded EBG Structures for the Realization of Ultra-Wideband Artificial Magnetic Conductor", in *Proc. IEEE Antennas and Propagation Society Int. Symp.*, 2003, pp 427-430. Only simulation results were presented in this paper with ideal NFCs; no details are provided of how to realize the stable NFCs needed in such an application.

NFCs (non-foster circuits) are so named because they violate Foster's reactance theorem and overcome these limitations by canceling the antenna or surface immittance over broad bandwidths with negative inductors or negative capacitors. See the article by Kern mentioned above and also S. E. Sussman-Fort and R. M, Rudish, "Non-Foster impedance matching of electrically-small antennas, "*IEEE Trans. Antennas and Propagat.*", vol. 57, no, 8, August 2009. These non-passive reactive elements are synthesized using Negative Impedance Converters (NICs) or Negative Impedance Inverters (NIIs). NICs are feedback circuits that convert a passive capacitor to a negative capacitor while NIIs are feedback circuits which convert a passive capacitor to a negative inductor. It is also possible to use passive inductors to make negative capacitors and negative inductors using these circuits, but since a passive capacitor is easier to make using semiconductor fabrication techniques, it is assumed herein that a passive capacitor is preferably used to generate a negative inductance (using a NII) or a negative capacitance (using a NIC) as needed herein.

The main challenge in realizing NFCs is stability; NICs and NIIs are conditionally stable, and the stability margin typically approaches zero as immittance cancellation becomes more complete. For this reason, few stable demonstrations are reported in the literature at and above VHF frequencies. Sussman-Fort and Rudish noted above and K. Song and R. G. Rojas, "Non-Foster impedance matching of electrically small antennas," *Proc. IEEE Ant. Prop. Int. Symp.*, July 2010 have reported negative-capacitance circuits and measured improvement in the realized gain of electrically small monopole antennas.

A well-known class of AIS consists of printed metallic patterns on an electrically thin, grounded dielectric substrate. They can be used to synthesize narrow-band Artificial Magnetic Conductors (AMC) for the realization of low profile antennas as well as suppress surface waves over a narrow bandwidth. They can be made tunable. See, for example, U.S. Pat. No. 6,538,621 to Sievenpiper et al mentioned above. Furthermore, HRL has shown that they can be used to build directional antennas with arbitrary radiation patterns and direct incident energy around obstacles using conformal surfaces with a holographic patterning technique. See the paper noted above by B. H. Fong, et al. entitled "Scalar and Tensor Holographic Artificial Impedance Surfaces". The main issue with prior art AISs is their useful bandwidth, i.e. the frequency range in which their impedance is maintained near a prescribed value. This invention addresses that issue by increasing the bandwidth of AISs (and thus also synthesized AMCs). The invention can also be used to increase the bandwidth of FSSs.

BRIEF DESCRIPTION OF THE INVENTION

The present invention can be used to modify prior art AMCs, AISs and FSSs to increase their bandwidths, but it is described primarily with reference to tunable AISs (and AMCs are considered to be a subset of AISs, since an AIS can perform as a AMC when operated as such). Less description is given a tunable FSS embodiment since there is probably less of a need for a wideband adaptable FSS than a wideband adaptable AIS/AMC. Given the fact that is invention can be used to increase the bandwidth of prior art tunable AMCs, AISs and FSSs, those surfaces are generically referred to an simply tunable impedance surfaces herein In one aspect the present invention provides a tunable impedance surface, the tunable impedance surface comprising: (a) a plurality of elements disposed in a two dimensional array; and (b) a plurality of non-Foster circuits for controllably varying a negative inductance or capacitance between at least selected ones of adjacent elements in said two dimensional array.

In another aspect the present invention provides a method of increasing the bandwidth of a prior art AMC, AIS and/or FSS, the prior art AMC, AIS and/or FSS comprising a two dimensional array of metallic patches or elements disposed on a dielectric surface, the method including connecting tunable non-Foster circuits between adjacent ones of said metallic patches or elements, the tunable non-Foster circuits synthesizing a tunable negative inductance or a tunable negative capacitance between said adjacent ones of said metallic patches or elements.

DETAILED DESCRIPTION

Non-Foster circuits provide a way to increase the bandwidth of electrically small antennas beyond the Wheeler/Chu limit. See U.S. patent application Ser. No. 12,768,563 entitled "Non-Foster Impedance Power Amplifier" filed Apr. 27, 2010. In the embodiments disclosed herein, Non-Foster circuits are utilized to create wideband Artificial Impedance Surfaces (AISs) and wideband Frequency Selective Surfaces (FSSs). Non-Foster circuits are named for the fact that they violate Foster's theorem for passive networks, and may have a pure reactance that is a decreasing function of frequency. They enable one to create effective negative capacitors or negative inductors over decade bandwidths. In embodiments according to the principles of the present invention, non-Foster negative inductors are used with an otherwise passive AIS 5 to achieve a wideband impedance surface with a reflection coefficient that varies slowly with frequency, see FIG. 7.

Figure 1A:
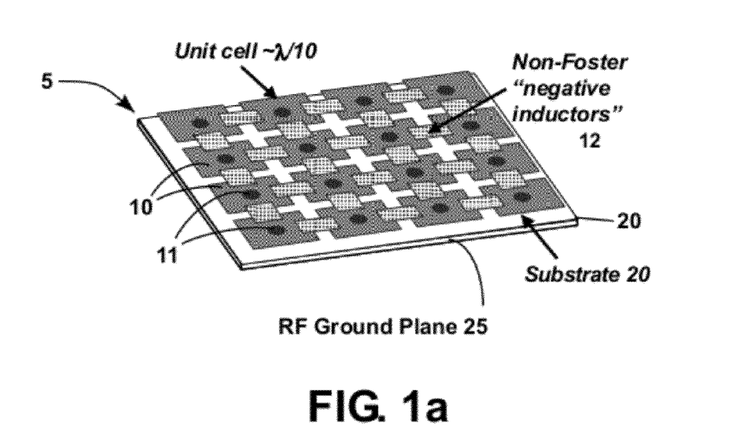
FIG. 1*a* depicts a passive AIS where the traditional capacitive elements disposed between adjacent conductive patches are replaced by negative inductive loading using a NII (an active non-Foster circuit) for broadband reactance match.

Comparing FIG. 1*a* with a prior art tunable AIS/AMC/FSS (see, for example, the Sievenpiper patents noted above), the capacitive elements which were used in the prior art between adjacent conductive patches 10 (which form unit cells in a tunable AIS/AMC/FSS) are replaced with a variable negative inductive load using a NII 12 in this embodiment. The patches 10 are typically metallic geometric patches having a dimension on each side equal to about one tenth of the frequency of interest (which may be the center of the frequency band of interest). Without implying a limitation, the patches can have a square shape as indicated in FIG. 1*a* or they can have some other convenient, repeating geometric shape such as the hexagonal and triangular shapes depicted in U.S. Pat. No. 6,538,621 noted above. The particular shape selected for the patches will likely affect the number of tuning elements used between adjacent patches 10. The frequency of interest is (i) the frequency at which antennas (not shown), but which may be mounted on the AIS 5, operate when the AIS 5 functions as a AMC or (ii) the frequency at which the AIS is operated as when it functions as an antenna itself (see the paper by Fong). The patches 10 are mounted on a dielectric surface 20 which generally has an associated RF ground plane 25 and the patches are coupled to the RF ground plane in this embodiment by means of metallic via conductors 11 which couple each patch 10 to the underlying RF ground plane 25. If no RF ground plane 25 is present (and hence no via conductors 11 are also not present) then the surface depicted by FIG. 1a would be called a FSS. If the RF ground plane 25 is present but no via conductors 11 are used, then the surface would be called a AIS. If both RF ground plane 25 and the via conductors 11 are present, then the surface is called a AMC. The patches 10 are connected to neighboring patches 10 by means of the NIIs 12 (and in some embodiment NICs 12) located between neighboring patches 10 for FSSs, AISs and AMCs. The NIIs provide a negative inductance between neighboring patches 10 while NICs can be used in some embodiments to provide a negative capacitance between neighboring patches 10. The NICs (or NIIs if used) 12 may be mounted on a single, common surface 20 as depicted by FIG. 1a or in a stacked arrangement on multiple surfaces 20. The preferred embodiment disclosed herein uses NIIs 12 and therefore the non-Foster circuits will be referred to as NIIs in most of this disclosure, but it should be borne in mind that in some embodiments it will prove useful to substitute NICs for the NIIs mentioned herein.

Figure 1B:
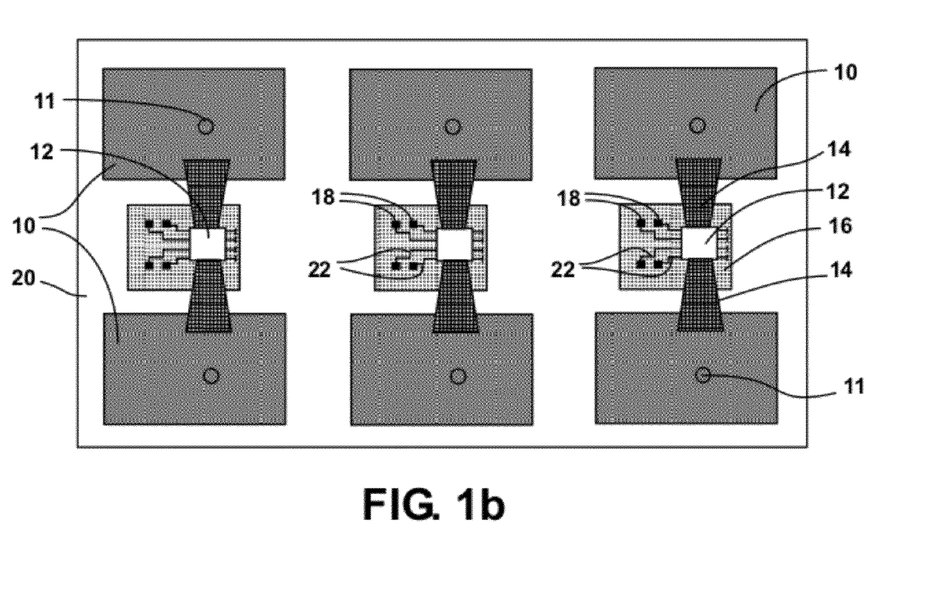
FIG. 1*b* shows a top view of the embodiment in FIG. 1*a* illustrating the connections between the components; only a few of the patches and NIIs are shown for ease of illustration.

FIG. 1b illustrates a portion of the embodiment in FIG. 1a in greater detail. FIG. 1b shows that the NIIs 12 are themselves are preferably mounted on a printed circuit board 16. Only three NIIs 12 are depicted in this view of ease of illustration, it being understood that additional NIIs 12 would typically be employed laterally between neighboring patches 10 as depicted in the embodiment of FIG. 1a. The printed circuit board 16 comprises conductive traces 22 between thru pins 18 and connection terminals of the NII 12 for supplying the control signals and voltages described later. The negative inductance connections of the NII 12 are connected to patches 10 by conductors 14 which may be solder or a combination of metal patches and solder.

Only six patches 10 are depicted in FIG. 1b and only sixteen patches 10 are depicted in FIG. 1a for ease of illustration. It should be understood that real life embodiments of this technology are likely to have hundreds or thousands or even more patches 10 and associated NIIs 12 disposed on a common substrate 20.

Figure 1C:
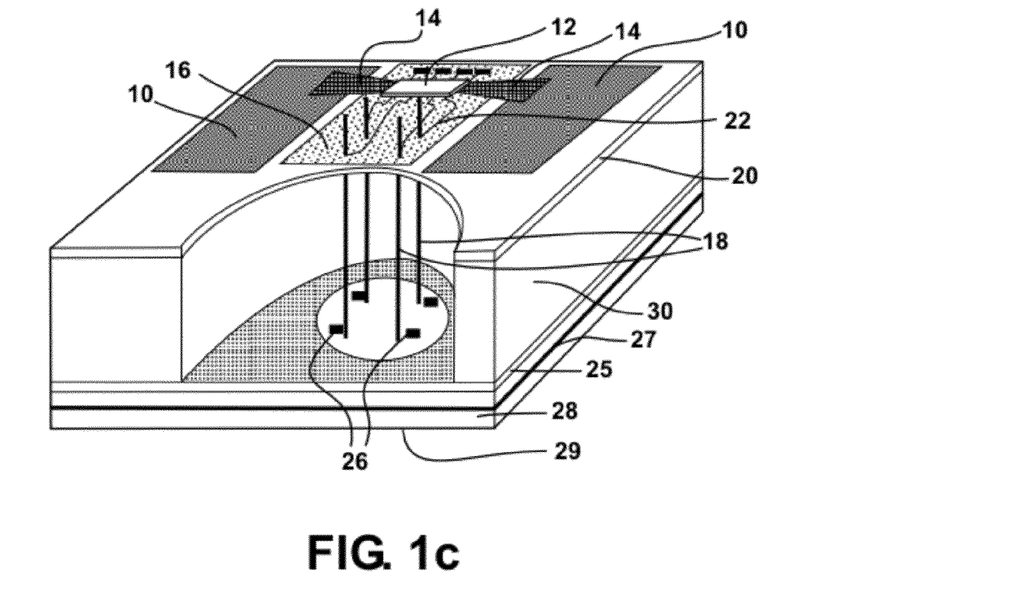
FIG. 1*c* shows a cut-away perspective view of a section of the embodiment in FIG. 1*a*.

FIG. 1c illustrates a cut-away perspective view of an embodiment shown in FIGS. 1a and 1b. Not all components are shown for ease of illustration (for example, only one of the via conductors 11 used to connect each of the patches 10 to the RF ground plane 25 is shown in this view for ease of illustration). Without implying a limitation and with the understanding alternative embodiments consistent with the principles of the present invention illustrated in FIGS. 1a-1d, FIG. 1c shows that the thru pins 18 preferably extend below the dielectric 20 through a layer 30 to make connection to a wiring layer 27 of a printed circuit board 28. The printed circuit board 28 may include the RF ground plane 25 on one of it surfaces and a DC ground plane 29 on the other of it surfaces. The thru pins 18 may be coupled to the RF ground plane 25 via bypass capacitors 26 shown in FIG. 1c, for example, and bypass capacitors 23 may also be used closer to NII 12 to couple wires 23 to RF ground 25 (via plates 12 and via conductors 11). The layer 30 may comprise a dielectric or other material selected for reasons other than its electrical properties. For example, layer 30 may be electrically conductive with insulating vias provided (but not shown) to allow the thru pins 18 to pass through it without contacting it.

Figure 1D:
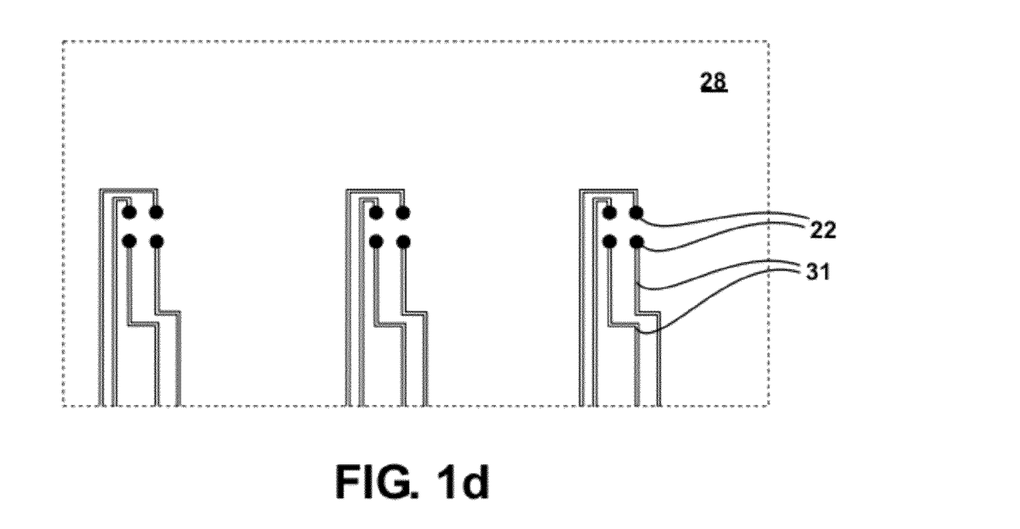
FIG. 1*d* shows the underside of the embodiment of FIG. 1*a*.

FIG. 1d shows the wiring layer 27 of the printed circuit board 28 of the embodiment of FIG. 1c and illustrates that the printed circuit board 28 may include conductive traces 31 between the thru pins 18 and the edge of the printed circuit board 28. Moreover, the printed circuit board 28 may also include a DC ground 29 covering all or part of the underside of the printed circuit board 28. If the DC ground 29 covers all of the underside of the printed circuit board 28, then conductive traces 31 are preferably be sandwiched in a multi-layered printed circuit board 28 between the DC ground 29 and the RF ground plane 25. The traces 31 may occur on a common layer or on multiple layers as needed to connect up the NIIs 12.

Figure 2:
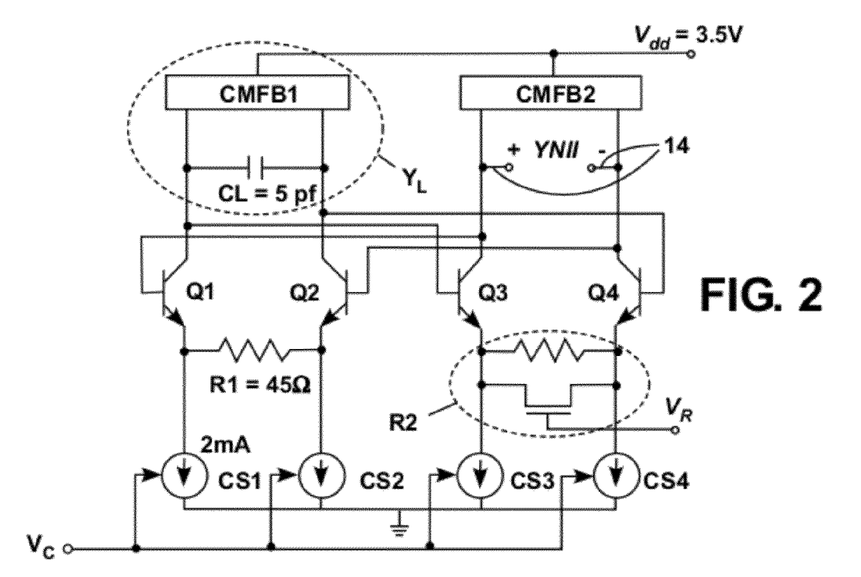
FIG. 2 is a schematic diagram of the negative inductance integrated circuit, which circuit transforms the load capacitance $C_L$ into a negative inductance at the terminals, and has been implemented as a IC using in the IBM 8HP SiGe process.

The NIIs 12 are preferably implemented as Integrated Circuits (ICs) which are disposed on the surface 20 of FIG. 1a as described above using the aforementioned printed circuit boards 16. FIG. 2 is a schematic diagram of a preferred embodiment of a negative inductance integrated circuit, which circuit transforms the load capacitance $C_L$ into a negative inductance at the terminals $Y_{NII}$. Terminals $Y_{NII}$ of each NII 12 are connected to the neighboring conductive patches 10 shown in FIG. 1a by means of conductors 12. The core of the negative-inductance IC 12 is preferably a differential NII (see FIG. 2), which preferably comprises two cross-coupled differential pairs of NPN transistors in this embodiment thereof. The NII transforms the load admittance (connected between the collectors of Q1 and Q2) to its negative inverse-scaled by a conversion factor-at the RF terminals (between the collectors of Q3 and Q4). Neglecting parasitics at the output node:

$Y_{NII} = -K^2/Y_L$ where to a first order:

$K^2 = g_m^2/[(2+g_m R_1)(2+g_m R_2)]$ and gm is the transconductance of each transistor and is assumed to be identical for Q1-Q4, R1 is the resistance between the emitters of Q1 and Q2, and R2 is the resistance between the emitters of Q3 and Q4. Neglecting all parasitics, the input inductance is given by $L_{NII} = -C_L/K^2$. $L_{NII}$ is tuned by varying R2, which is accomplished by varying the voltage $V_R$ on the gate of NFET M1. In the embodiment of the NII of FIG. 2, R2 comprises the parallel combination of a 100 Ohm fixed resistor and NFET M1 which acts as a resistor with a resistance that depends on the voltage between the gate ($V_R$) and the source/drain. The parallel combination of M1 and the fixed resistor results in a variable resistance from 20-100 Ohms in this embodiment. Control signal $V_c$ can be used to adjust the transconductance gm by setting the bias current of the current sources CS1-CS4 and thus effects the value of $K^2$ noted above.

In this embodiment, current sources CS1-CS4 at the emitters of Q1-Q4 set the quiescent current preferably to 2 mA per transistor (which current may be controlled by the control signal $V_c$), and the collector voltage is set by common-mode feedback circuits CMF B1 and CMF B2. The base voltages are equal to the collector voltages (except for the effects of device mismatch) because the differential pairs are DC coupled. The common-mode feedback circuits CMF B1 and CMF B2 are shown in greater detail in FIG. 9 along with other circuits details. The circuit of FIG. 2 has a $V_{dd}$ and a DC ground connection in addition to $V_R$ and $V_c$ (in addition to the connections 12 to patches 10). The $V_{dd}$, DC ground, $V_R$ and $V_c$ connections account for the four thru pins 18 depicted by FIG. 1c. Since one of the pins is coupled to DC ground, it may be coupled directly to the DC ground plane 29 (if used) instead of being connected to DC ground via a wire 31 in the wiring layer 27. The $V_c$ connection may be omitted in some embodiments since while the ability to control the current generators of FIG. 2 may be useful, it is expected that it will not be needed or necessary for many embodiments.

The circuit of FIG. 2 has been implemented on a 1×1 mm² die (see FIG. 3) using the IBM 8HP SiGe BiCMOS process. $C_L$, in this particular implementation, is composed of two 2.5-pF Metal-Insulator-Metal (MIM) capacitors, connected in parallel, and M1, in this particular implementation, is a thick-oxide NFET with width and length 60 and 0.48 μm, respectively. The RF pads are preferably disposed on the left and right sides of the IC and are preferably spaced 750 μm center to center. When used with the AIS 5 of FIG. 2, each RF pad is coupled to a neighboring patch 10. The DC pads are preferably provided on both the top and bottom: $V_{dd}$ and GND supply power, while $V_c$ controls the quiescent current and $V_R$ tunes the negative inductance. The pads on top are redundant to the DC pads on bottom: $V_R$, $V_{dd}$, $V_c$, and GND from left to right. As a result, this implementation of the circuit is an IC which is preferably symmetric (in a 180 degree rotation), which may be advantageous for assembly in certain cases. Of course, if such symmetry is not needed, then the extra set of pads can be eliminated.

Figure 3:
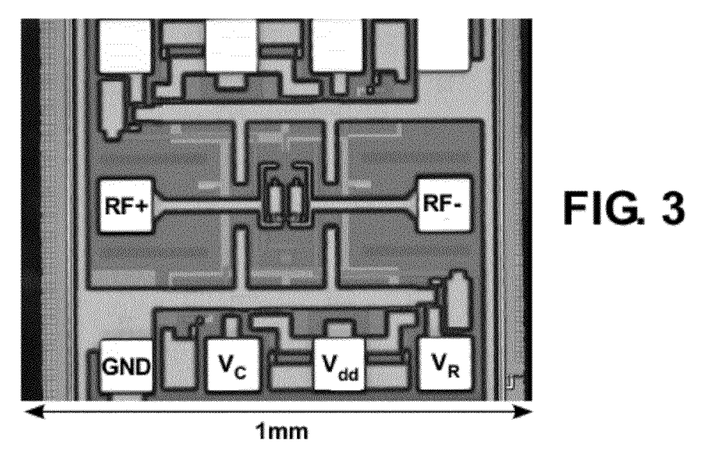
FIG. 3 depicts a 1×1 mm² die of the negative-inductance circuit. There are two RF contacts, two power supply contacts, and two control contacts.
Figure 4:
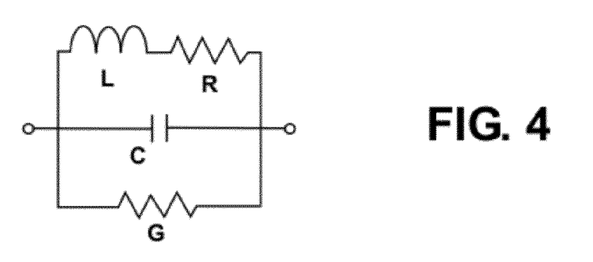
FIG. 4 is a schematic of the equivalent circuit of FIGS. 2 and 3.
Figure 5:
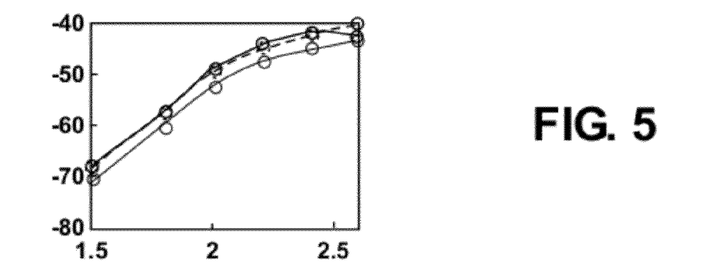
FIG. 5 is a plot the equivalent circuit parameters of FIG. 4 as a function of control voltage $V_R$.

The embodiments of the NII 12 of FIGS. 2 and 3 realizes a stable tunable negative-inductance integrated circuit. The 1-port S-parameters of three of the SiGe ICs depicted by FIG. 3 (in parallel with a 43 nH inductor, which ensures circuit stability and approximates the loading of the AIS) were measured from 30 MHz to 3 GHz as a function of the tuning voltage $V_R$. Then in post processing, the 43 nH inductor was removed from the measured S-parameters with an Open-Short-Load calibration and the equivalent circuit model parameters of the negative inductance circuit were extracted. FIG. 4 is a schematic of the equivalent circuit of FIGS. 2 and 3, and FIG. 5 plots the equivalent circuit parameters as a function of $V_R$. This equivalent circuit data shows a stable tunable negative inductance from −70 nH to about −43 nH for all three functional non-Foster IC dice tested. To our knowledge this is the first demonstration of a stable non-Foster IC.

Figure 6:
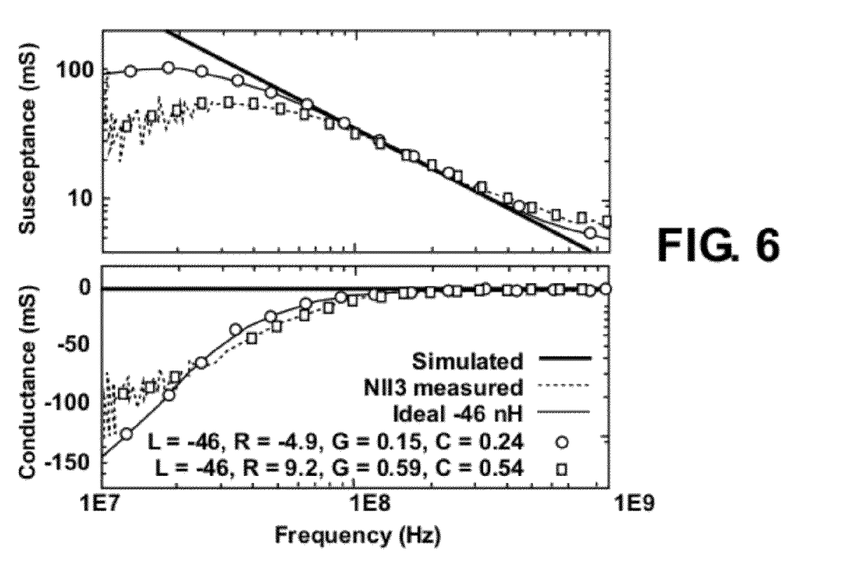
FIG. 6 is a graph showing the circuit admittance when $V_R=2.2$ V for both the third IC tested and the simulation.

In FIG. 4, L and R are negative inductance and resistance, respectively, which are primarily contributed by the negative inversion of $Y_L$. G and C are positive, and are primarily caused by shunt parasitics at the output nodes. The admittance of the model agrees very well with both the measured and simulated (Cadence Spectre) admittances from 10 MHz to 1 GHz. The case when $V_R$=2.2 V is shown in FIG. 6 for both the third IC tested (NII3) and the simulation. In FIG. 5 depicts the extracted equivalent circuit values from the three functioning non-Foster IC dice tested. The inductance was tuned from −70 to −45 nH as $V_R$ was varied from 1.5 to 2.6 V.

For additional information regarding the circuit of FIGS. 2 and 3 and the testing of the three ICs mentioned above, see Appendix A: C. R. White, J. W. May and J. S. Colburn, "A Variable Negative-Inductance Integrated Circuit at UHF Frequencies", IEEE MWCL, Vol. 22, No. 1, January 2012, which is hereby incorporated herein by reference, and Appendix A: D. J. Gregoire; C. R. White, and J. S. Colburn, "Non-Foster Metamaterials", which is also hereby incorporated herein by reference.

Figure 7:
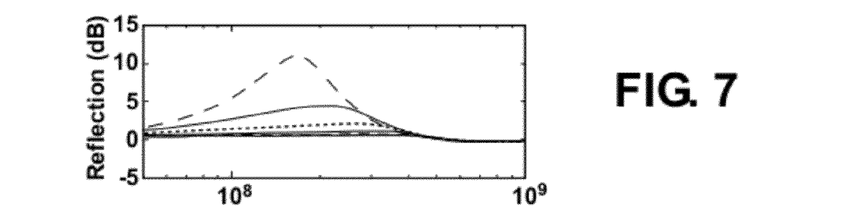
FIGS. 7 and 8 contain plots of the simulated reflection coefficient for a normal-incidence plane wave off an AIS loaded with a tunable negative inductance circuit.
Figure 8:
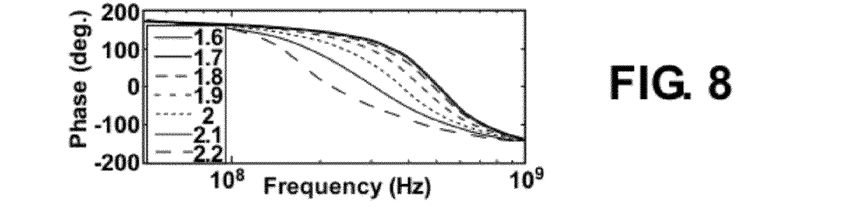

FIGS. 7 and 8 contain plots of the simulated reflection coefficient for a normal-incidence plane wave off an AIS loaded with a tunable negative inductance circuit 12. The AIS unit cell geometry used is a 65×65 mm metal patch 10 with a 10 mm gap between patches 10 disposed on a 1 inch foam substrate. In these simulations, the AIS is modeled by a full-wave simulation assuming an infinite periodic structure at normal incidence and the negative inductance circuit is modeled as the full small-signal model that was used to design the circuit in FIGS. 2 and 3. These reflection results indicate that slowly-varying impedance can be achieved over a relatively wide band. In addition, this slowly-varying impedance can be tuned by changing the tuning voltage $V_R$.

Figure 9:
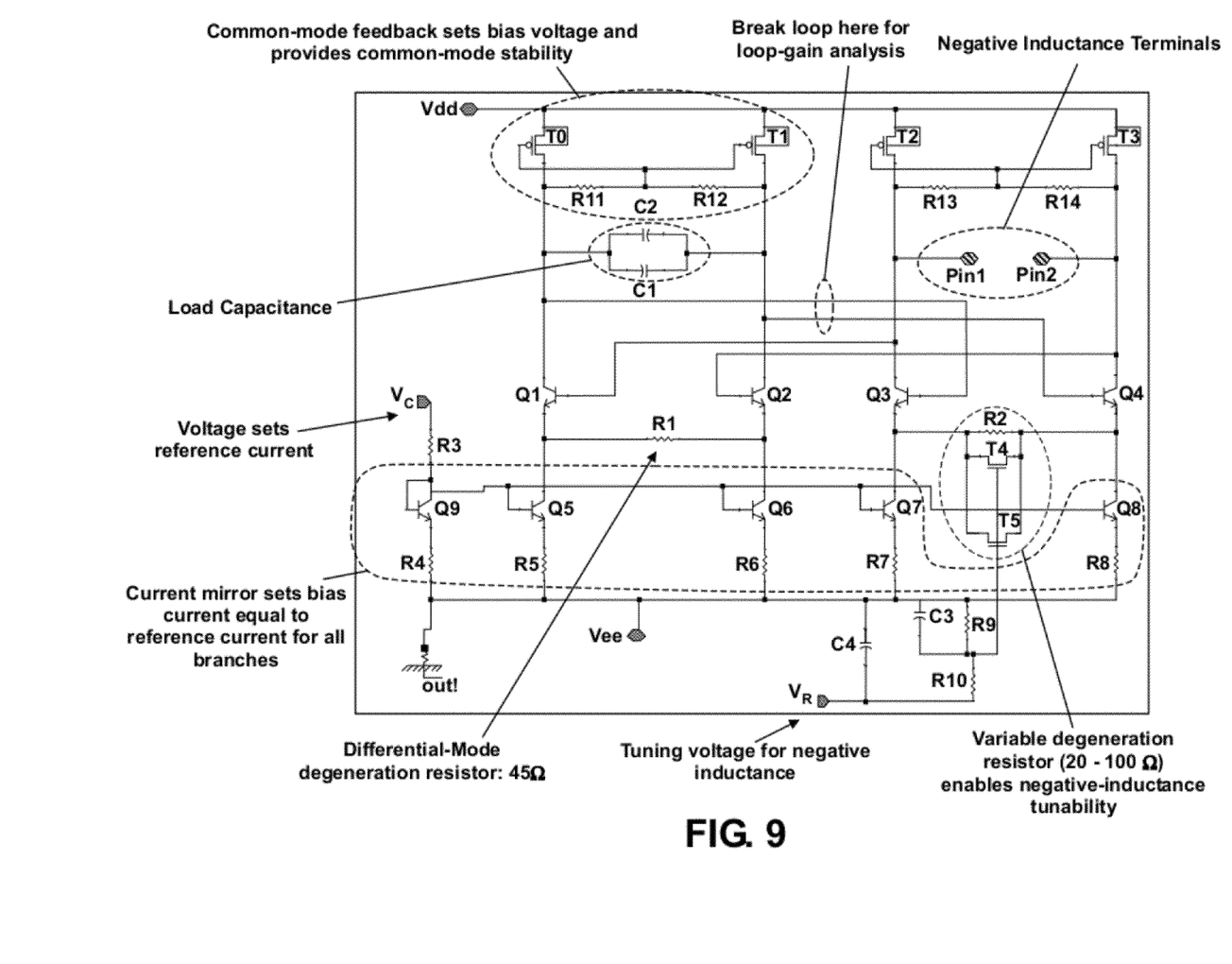
FIG. 9 is a design schematic of the negative inductance circuit showing more details than the more simplified schematic of FIG. 2.

Another schematic of the negative inductance circuit is shown in FIG. 9 which includes legends providing additional information regarding the operation of the circuit of FIG. 2 and shows the suggested circuit in greater detail.

Having described the invention in connection with certain embodiments thereof, modification will now suggest itself to those skilled in the art. As such, the invention is not to be limited to the disclosed embodiments except as is specifically required by the appended claims.

What is claimed is:

1. A tunable impedance surface, the tunable impedance surface comprising: (a) a plurality of elements disposed in a two dimensional array; and (b) a plurality of non-Foster circuits for controllably varying a negative inductance or capacitance between at least selected ones of adjacent elements in said two dimensional array.

2. The tunable impedance surface of claim 1 further including a substrate having first and second major surfaces, said substrate supporting a ground plane on the first major surface thereof and supporting said plurality of elements and the plurality of non-Foster circuits on the second major surface thereof, the substrate having a thickness such that a distance between the ground plane and said plurality of elements is less than a wavelength of a radio frequency of interest.

3. The tunable impedance surface of claim 2 wherein the plurality of non-Foster circuits is adjustable in response to one or more control signals to spatially tune the tunable impedance surface.

4. The tunable impedance surface of claim 3 wherein the plurality of elements each have an outside diameter which is less than the wavelength of the radio frequency of interest.

5. The tunable impedance surface of claim 1 wherein the elements are directly or ohmically coupled to the ground plane by vias in a substrate supporting said ground plane, said plurality of elements and said plurality of non-Foster circuits.

6. The tunable impedance surface of claim 1 further including a substrate having two major surfaces, said substrate supporting said plurality of elements and the plurality of non-Foster circuits on a common major surface thereof.

7. The tunable impedance surface of claim 6 wherein the plurality of non-Foster circuits each have an adjustable negative inductance or capacitance which is controlled by a control signal for spatially tuning the tunable impedance surface.

8. The tunable impedance surface of claim 1 wherein the plurality of non-Foster circuits comprises a plurality of negative inductance or capacitance integrated circuits, each negative inductance or capacitance integrated circuit of said plurality of negative inductance or capacitance integrated circuits being coupled between adjacent ones of said plurality of elements.

9. The tunable impedance surface of claim 8 wherein the negative inductance or capacitance circuits in said plurality of variable negative inductance or variable negative capacitance circuits are each controlled by a control voltage.

10. The tunable impedance surface of claim 1 wherein the non-Foster circuits in said plurality of non-Foster circuits each comprise:
   two pairs of cross-coupled transistors;
   a reactive load coupled to first current carrying electrodes of a first one of the pairs of cross-coupled transistors and a first control resistance coupled to second current carrying electrodes of said first one of the pairs of cross-coupled transistors;

a second control resistance coupled to current carrying electrodes current carrying electrodes of a second one of the pairs of cross-coupled transistors;

current sources for suppling a flow of current to at least one of the current carrying electrodes of each pair of cross-coupled transistors;

two common-mode feedback networks, each common-mode feedback network being coupled to current carrying electrodes of each pair of cross-coupled transistors; and terminals coupled to current carrying electrodes of said second one of the pairs of cross-coupled transistors, a function of the product of the resistances of the first and second control resistances setting a conversion ratio between the reactive load and a load appearing across said terminals, said terminals being coupled to at least selected ones of said adjacent elements in said two dimensional array.

11. A tunable impedance surface, the tunable impedance surface comprising: (a) a plurality of elements disposed in a two dimensional array; and (b) an arrangement of variable negative reactance circuits for controllably varying negative reactance between at least selected ones of adjacent elements in said two dimensional array, wherein the negative reactance circuits in said arrangement of variable negative reactance circuits each comprise two pairs of differentially coupled transistors, a capacitor coupled between current carrying electrodes of a first pair of said two pairs of differentially coupled transistors with a negative reactance being realized between currently carrying electrodes of a second pair of said two pairs of differentially coupled transistors.

12. A tunable impedance surface, the tunable surface comprising: (a) a plurality of elements disposed in a two dimensional array; and (b) a plurality of variable negative reactance circuits for controllably varying a negative reactance applied between at least selected ones of adjacent elements in said two dimensional array wherein the negative reactance is produced by a negative inductance.

13. A method of increasing the bandwidth of an Artificial Magnetic Conductor (AMC), an Artificial Impedance Surface (AIS) and/or a Frequency Selective Surface (FSS), the AMC, AIS and/or FSS comprising a two dimensional array of metallic patches or elements disposed on a dielectric surface, the method including connecting tunable non-Foster circuits between adjacent ones of said metallic patches or elements, the tunable non-Foster circuits synthesizing either a variable yet stable negative inductance between said adjacent ones of said metallic patches or elements or a tunable yet stable negative capacitance between said adjacent ones of said metallic patches or elements.

14. The method of increasing the bandwidth of the AMC, AIS and/or FSS of claim 13 wherein the tunable non-Foster circuits synthesizing a variable yet stable negative inductance between said adjacent ones of said metallic patches or elements.

* * * * *

UNITED STATES PATENT AND TRADEMARK OFFICE
CERTIFICATE OF CORRECTION

| | | |
|---|---|---|
| PATENT NO. | : 8,976,077 B2 | Page 1 of 1 |
| APPLICATION NO. | : 13/441659 | |
| DATED | : March 10, 2015 | |
| INVENTOR(S) | : Joseph S. Colburn et al. | |

It is certified that error appears in the above-identified patent and that said Letters Patent is hereby corrected as shown below:

Title Page, Item (54) and in the specification, column 1, lines 1-2, the title "WIDEBRAND ADAPTABLE ARTIFICIAL IMPEDANCE SURFACE" should be replaced with the title "WIDEBAND TUNABLE IMPEDANCE SURFACES".

Signed and Sealed this
Sixteenth Day of June, 2015

Michelle K. Lee
*Director of the United States Patent and Trademark Office*